United States Patent
Wang

(10) Patent No.: US 10,679,720 B2
(45) Date of Patent: Jun. 9, 2020

(54) MEMORY CIRCUIT AND TESTING METHOD THEREOF

(71) Applicant: Nuvoton Technology Corporation, Hsinchu (TW)

(72) Inventor: Cheng-Chih Wang, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 0 days.

(21) Appl. No.: 16/015,220

(22) Filed: Jun. 22, 2018

(65) Prior Publication Data

US 2019/0198133 A1    Jun. 27, 2019

(30) Foreign Application Priority Data

Dec. 21, 2017    (TW) .............................. 106145149 A

(51) Int. Cl.
| | | |
|---|---|---|
| G11C 7/00 | (2006.01) | |
| G11C 29/50 | (2006.01) | |
| G11C 13/00 | (2006.01) | |
| G11C 29/32 | (2006.01) | |
| G11C 29/46 | (2006.01) | |
| G11C 29/12 | (2006.01) | |
| G11C 29/44 | (2006.01) | |

(52) U.S. Cl.
CPC ............ *G11C 29/50* (2013.01); *G11C 13/004* (2013.01); *G11C 13/0069* (2013.01); *G11C 29/1201* (2013.01); *G11C 29/32* (2013.01); *G11C 29/46* (2013.01); *G11C 2029/1208* (2013.01); *G11C 2029/3202* (2013.01); *G11C 2029/4402* (2013.01); *G11C 2213/31* (2013.01)

(58) Field of Classification Search
CPC ... G11C 29/50; G11C 13/004; G11C 13/0069; G11C 2213/31; G11C 29/1201; G11C 29/32; G11C 29/46
USPC .................................................. 365/189.15
See application file for complete search history.

(56) References Cited

U.S. PATENT DOCUMENTS

| | | | | |
|---|---|---|---|---|
| 4,827,476 A | * | 5/1989 | Garcia ............. | G01R 31/31838 714/718 |
| 5,155,732 A | * | 10/1992 | Jarwala ............ | G01R 31/31854 714/726 |
| 5,488,612 A | * | 1/1996 | Heybruck ........ | G01R 31/31838 714/724 |

(Continued)

FOREIGN PATENT DOCUMENTS

TW    I607444    12/2017

OTHER PUBLICATIONS

"Office Action of Taiwan Counterpart Application," dated Jul. 3, 2018, pp. 1-8.

*Primary Examiner* — Viet Q Nguyen
(74) *Attorney, Agent, or Firm* — JCIPRNET

(57) ABSTRACT

A memory circuit and a testing method thereof are provided. The memory circuit includes multiple stage non-volatile memory (NVM) devices. An Nth stage NVM device includes a logic memory circuit, an NVM element, a write circuit and a read circuit. The logic memory circuit receives external data via a data input terminal in a normal mode and receives test data via a test input terminal in a test mode. The write circuit writes the test data or the external data to the NVM element during a writing period. The read circuit transmits stored data stored in the NVM element to an output terminal of the logic memory circuit during a reading period.

6 Claims, 9 Drawing Sheets

(56) References Cited

U.S. PATENT DOCUMENTS

| | | | | |
|---|---|---|---|---|
| 5,544,107 | A * | 8/1996 | Hill | G01R 31/31857 365/201 |
| 5,864,565 | A * | 1/1999 | Ochoa | G01R 31/2884 714/735 |
| 5,951,703 | A * | 9/1999 | Sprouse | G01R 31/31838 714/730 |
| 6,088,820 | A * | 7/2000 | Jyo | G11C 29/12 365/201 |
| 6,505,313 | B1 * | 1/2003 | Phan | G11C 29/40 714/718 |
| 6,757,854 | B1 * | 6/2004 | Zhao | G11C 29/003 714/719 |
| 6,833,281 | B2 * | 12/2004 | Gilliam | G01R 31/3004 324/762.02 |
| 7,392,449 | B2 * | 6/2008 | Burdine | G06F 11/2215 714/726 |
| 7,478,296 | B2 * | 1/2009 | Rajski | G01R 31/31813 714/726 |
| 9,222,974 | B2 | 12/2015 | Srinivasan et al. | |
| 9,355,732 | B2 | 5/2016 | Lasser | |
| 9,575,535 | B2 * | 2/2017 | Wang | G06F 1/305 |
| 2006/0218452 | A1 * | 9/2006 | Njinda | G11C 29/14 714/718 |
| 2007/0268755 | A1 * | 11/2007 | New | G11C 7/1012 365/189.15 |
| 2008/0204072 | A1 * | 8/2008 | Sasao | H03K 19/17728 326/38 |
| 2008/0278182 | A1 * | 11/2008 | Agarwal | G01R 31/2884 324/713 |
| 2015/0138877 | A1 * | 5/2015 | Nebashi | H03K 19/18 365/158 |
| 2018/0233213 | A1 * | 8/2018 | Miyamae | G11C 29/38 |
| 2019/0057050 | A1 * | 2/2019 | Mathuriya | G06F 13/1668 |

* cited by examiner

MEMORY CIRCUIT AND TESTING METHOD THEREOF

CROSS-REFERENCE TO RELATED APPLICATION

This application claims the priority benefit of Taiwan application no. 106145149, filed on Dec. 21, 2017. The entirety of the above-mentioned patent application is hereby incorporated by reference herein and made a part of this specification.

BACKGROUND

Technical Field

The disclosure relates to a memory circuit and a testing method thereof.

Related Art

An automatic test pattern generation (ATPG) testing circuit is configured to provide a combinational logic circuit with test data so as to test the combinational logic circuit. In conventional functional testing on combinational logic circuits, a traditional logic memory circuit causes considerable power consumption. In view of this, a non-volatile memory may be added to the ATPG testing circuit in order to achieve low power consumption.

In addition, if testing is to be performed on the non-volatile memory in the testing circuit, an additional testing circuit is required so that whether the non-volatile memory operates normally can be tested.

SUMMARY

Embodiments of the disclosure provide a memory circuit and a testing method thereof, in which a non-volatile memory element in the memory circuit may be inspected without requiring an additional external circuit.

The memory circuit of the disclosure includes multiple stage non-volatile memory devices which are coupled in series. An Nth stage non-volatile memory device includes a logic memory circuit, a non-volatile memory element, a write circuit, and a read circuit. The logic memory circuit receives external data via a data input terminal in a normal mode and receives test data via a test input terminal in a test mode. The write circuit writes the test data or the external data to the non-volatile memory element during a writing period. The read circuit transmits stored data stored in the non-volatile memory element to an output terminal of the logic memory circuit during a reading period.

The testing method of the disclosure includes the following steps: disposing multiple stage non-volatile memory devices coupled in series, wherein the multiple stage non-volatile memory devices each includes a non-volatile memory element; receiving test data in a test mode; writing the test data to the non-volatile memory element during a writing period; and outputting stored data in the non-volatile memory element during a reading period.

Based on the above, in the memory circuit of the disclosure, multiple stage non-volatile memory devices are coupled in series to implement an ATPG testing circuit configuration. Additionally, the non-volatile memory element, the write circuit and the read circuit are added to realize a low energy consuming ATPG testing circuit. In addition, the logic memory circuit may receive the test data in the test mode, and the write circuit and the read circuit are operated. Accordingly, the non-volatile memory element in the memory circuit can be inspected without adding an additional external circuit to the ATPG testing circuit.

To make the above features and advantages of the disclosure more comprehensible, several embodiments accompanied with drawings are described in detail as follows.

DETAILED DESCRIPTION OF DISCLOSED EMBODIMENTS

Figure 1:
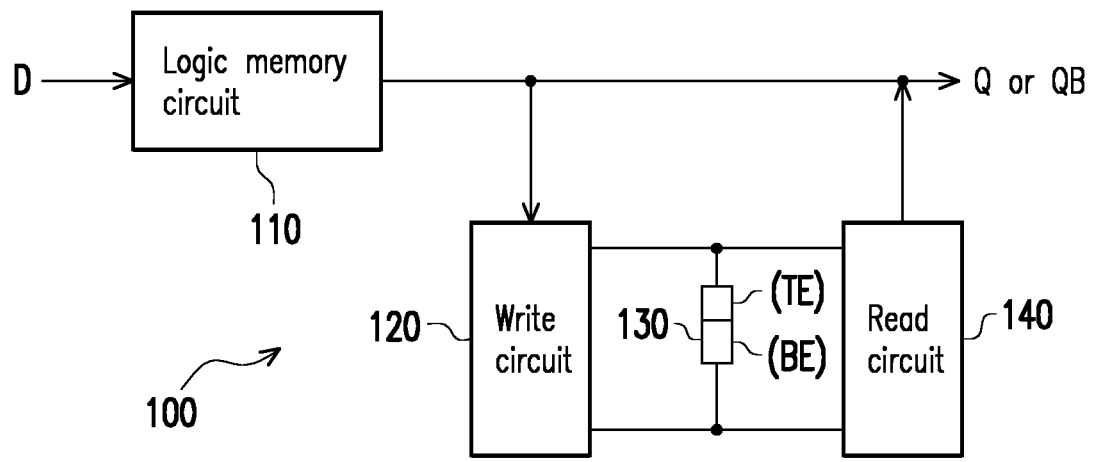
FIG. 1 illustrates a schematic circuit block diagram of a non-volatile memory device according to an embodiment of the disclosure.

The term "couple (or connect)" used in this specification (including claims) may refer to any direct or indirect connection means. For example, "a first device is coupled (or connected) to a second device" should be interpreted as "the first device is directly connected to the second device" or "the first device is indirectly connected to the second device through other devices or connection means." Moreover, wherever appropriate in the drawings and embodiments, elements/components/steps with the same reference numerals represent the same or similar parts. Elements/components/steps with the same reference numerals or names in different embodiments may be cross-referenced.

FIG. 1 illustrates a schematic circuit block diagram of a non-volatile memory (NVM) device 100 according to an embodiment of the disclosure. The NVM device 100 includes a logic memory circuit 110, a write circuit 120, an NVM element 130, and a read circuit 140. Depending on design needs, the logic memory circuit 110 may be any volatile memory element/circuit. For example, but not limited thereto, the logic memory circuit 110 may include a latch, a flip-flop, a static random access memory, or other memory circuits/elements with data storage functions. In comparison with the NVM element 130, the logic memory circuit 110 has a faster access speed.

The logic memory circuit 110 has an input terminal (for example, an input terminal D) and an output terminal (for example, an output terminal Q or an output terminal QB). An input terminal of the write circuit 120 is coupled to the output terminal (for example, the output terminal Q or the output terminal QB) of the logic memory circuit 110 to receive stored data of the logic memory circuit 110. A first output terminal of the write circuit 120 is coupled to a first terminal of the NVM element 130, and a second output terminal of the write circuit 120 is coupled to a second terminal of the NVM element 130. The NVM element 130 may be a resistive memory, a phase change memory (PCM) or other non-volatile memories. For example, in the embodiment shown in FIG. 1, the NVM element 130 includes a resistive memory element, wherein a top electrode TE of the resistive memory element serves as the first terminal of the NVM element 130 to be coupled to the first output terminal of the write circuit 120, and a bottom electrode BE of the resistive memory element serves as the second terminal of the NVM element 130 to be coupled to the second output terminal of the write circuit 120. A first input terminal of the read circuit 140 is coupled to the first terminal (for example, the top electrode TE) of the NVM element 130. A second input terminal of the read circuit 140 is coupled to the second terminal (for example, the bottom electrode BE) of the NVM element 130. An output terminal of the read circuit 140 is coupled to the output terminal (for example, the output terminal Q or the output terminal QB) of the logic memory circuit 110.

The NVM element 130 may be implemented in any manner by those applying the present embodiment according to their design needs. For example, but not limited thereto, a structure of the NVM element 130 may be formed by sequentially stacking "the bottom electrode BE, a variable resistor, and the top electrode TE" on a substrate in a vertical direction. For example, a material of the bottom electrode BE deposited on a single crystal substrate of a lanthanum aluminum oxide $LaAlO_3$ (LAO) may be an yttrium barium copper oxide $YBa_2Cu_3O_7$ (YBCO) film; a material of the variable resistor may be a crystalline praseodymium calcium manganese oxide $Pr_{1-x}Ca_xMnO_3$ (PCMO) film of a perovskite oxide; and a material of the top electrode TE may be an Ag film deposited by sputtering. Further, in addition to the aforesaid perovskite material, known ZnSe—Ge heterogeneous structures or metal oxides related to Ti, Nb, Hf, Zr, Ta, Ni, V, Zn, Sn, In, Th and Al may also be used as the material of the aforesaid variable resistor. Based on different materials of the variable resistor, the NVM element 130 may have different resistance characteristics. According to a direction of voltage applied between the top electrode TE and the bottom electrode BE, a resistance of the NVM element 130 may be reversibly changed. The effects of the resistive memory may be achieved by reading the resistance of the material of the variable resistor.

Figure 2:
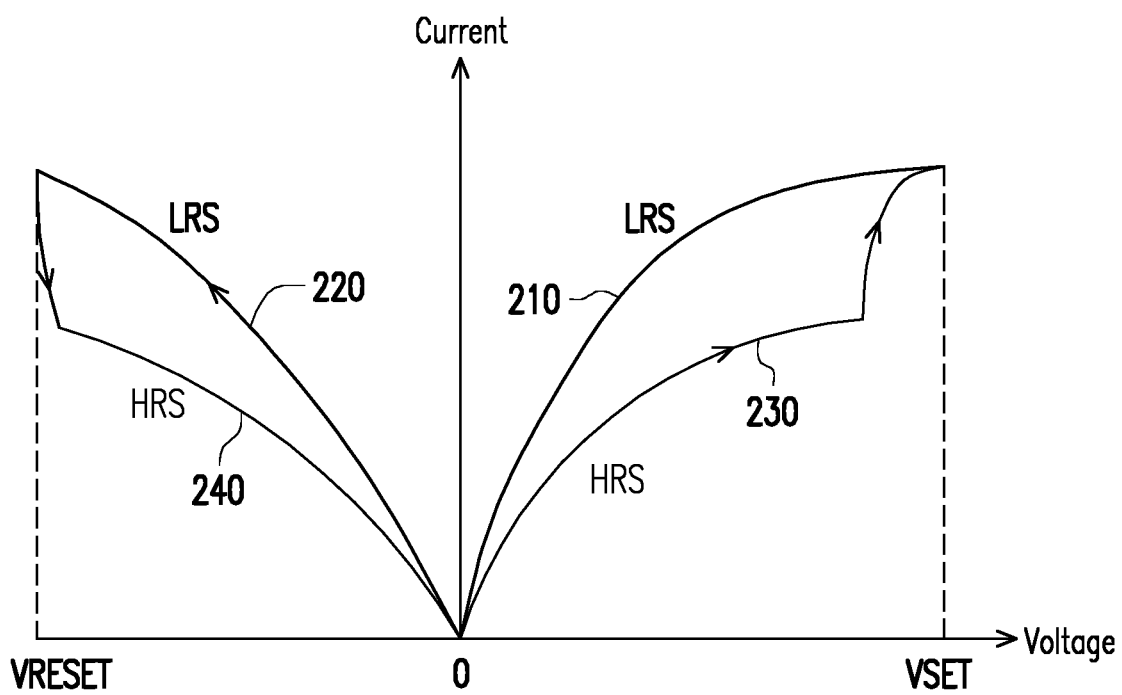
FIG. 2 is a schematic diagram illustrating characteristic curves of a non-volatile memory element shown in FIG. 1 according to an embodiment.

FIG. 2 is a schematic diagram illustrating characteristic curves of the NVM element 130 shown in FIG. 1 according to an embodiment. In FIG. 2, a horizontal axis indicates a voltage difference between the top electrode TE and the bottom electrode BE (i.e., a voltage at the top electrode TE minus a voltage at the bottom electrode BE) of the NVM element 130, and a vertical axis indicates a value of current flowing through the NVM element 130. A curve 210 and a curve 220 represent current-voltage characteristic curves of the NVM element 130 in a low resistance state LRS, and a curve 230 and a curve 240 represent current-voltage characteristic curves of the NVM element 130 in a high resistance state HRS. Depending on different materials, a resistance of the low resistance state LRS may be several ten or several hundred Ohm (for example, several KΩ), and a resistance of the high resistance state HRS may be greater than several tens of times the resistance of the low resistance state LRS (for example, 10K to 100MΩ). In the case where the NVM element 130 is in the high resistance state HRS (referring to the curve 230), when the voltage difference between the top electrode TE and the bottom electrode BE of the NVM element 130 is greater than a first threshold voltage (i.e., a set voltage VSET shown in FIG. 2), the NVM element 130 starts a "set" operation to change the resistance state of the NVM element 130 from the high resistance state HRS to the low resistance state LRS. Referring to the curve 220, when the voltage difference between the top electrode TE and the bottom electrode BE of the NVM element 130 in the low resistance state LRS is less than a second threshold voltage (i.e., a reset voltage VRESET shown in FIG. 2), the NVM element 130 starts a "reset" operation to change the resistance state of the NVM element 130 from the low resistance state LRS to the high resistance state HRS.

Figure 3:
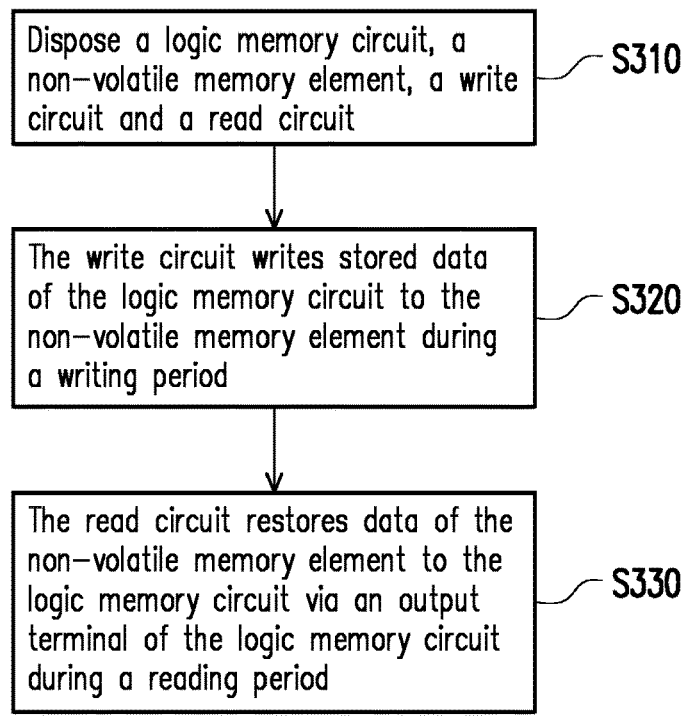
FIG. 3 is a schematic flowchart illustrating an operating method of a non-volatile memory device according to an embodiment of the disclosure.

FIG. 3 is a schematic flowchart illustrating an operating method of the NVM device 100 according to an embodiment of the disclosure. In step S310, the logic memory circuit 110, the write circuit 120, the NVM element 130, and the read circuit 140 are disposed in the NVM device 100. During a normal operation period, the write circuit 120 and the read circuit 140 may be disabled, and during the disabled period, the input terminal of the write circuit 120 and/or the output terminal of the read circuit 140 is in a floating state or a high impedance state. Therefore, the write circuit 120, the NVM element 130 and the read circuit 140 do not affect operation of the logic memory circuit 110 during the normal operation period.

During a writing period, the read circuit 140 may be disabled, and during the disabled period, the first input terminal and the second input terminal of the read circuit 140 are in the floating state or the high impedance state. The write circuit 120 writes (backs up) the stored data of the logic memory circuit 110 to the NVM element 130 during the writing period (step S320). For example, but not limited thereto, if the stored data of the logic memory circuit 110 is logic "1," the write circuit 120 may set the resistance state of the NVM element 130 to the low resistance state LRS during the writing period. If the stored data of the logic memory circuit 110 is logic "0," the write circuit 120 may reset the resistance state of the NVM element 130 to the high resistance state HRS during the writing period. The system determines whether to enter a standby mode, for example, to stand by or to shut down. When the system enters the standby or shutdown (power-off) mode, the NVM device 100 first performs a storing procedure (step S320, entering the writing period) to record information/data of the logic memory circuit 110 into the NVM element 130. After the aforesaid storing procedure (step S320) is completed, the system may stop supplying power to the logic memory circuit 110, so as to reduce power consumption of the logic memory circuit 110. At this point, the NVM device 100 has entered the standby or shutdown state/mode.

When the NVM device 100 ends the standby or shutdown state/mode, the NVM device 100 performs a restoring procedure (step S330, entering the reading period) to write the information stored in the NVM element 130 back to the logic memory circuit 110. In the restoring procedure, the output terminal (for example, the output terminal Q or the output terminal QB) of the logic memory circuit 110 is still in a not-ready state (for example, the floating state, the high impedance state or other unknown logic states). During the reading period, the write circuit 120 may be disabled, and during the disabled period, the first output terminal and the second output terminal of the write circuit 120 are in the floating state or the high impedance state. The read circuit 140 restores data of the NVM element 130 to the logic memory circuit 110 via the output terminal (for example, the output terminal Q or the output terminal QB) of the logic memory circuit 110 during the reading period. For example, but not limited thereto, if the "data" of the NVM element 130 is in the low resistance state LRS (equivalent to logic "1"), the read circuit 140 may restore logic "1" to the logic memory circuit 110 via the output terminal of the logic memory circuit 110 during the reading period. If the "data" of the NVM element 130 is in the high resistance state HRS (equivalent to logic "0"), the read circuit 140 may restore logic "0" to the logic memory circuit 110 via the output terminal of the logic memory circuit 110 during the reading period. After the aforesaid restoring procedure (step S330) is completed, the logic memory circuit 110 may then perform normal operations.

Therefore, the NVM device 100 and the operating method thereof as described in the present embodiment integrate the logic memory circuit 110 with the NVM element 130 by utilizing a specific architecture. During the normal operation period, the write circuit 120 and the read circuit 140 are disabled. Therefore, the NVM element 130 does not affect operation of the logic memory circuit 110 during the normal operation period. During the writing period, the read circuit 140 is disabled, while the write circuit 120 is enabled to write (back up) the stored data of the logic memory circuit 110 to the NVM element 130. During the reading period, the write circuit 120 is disabled, while the read circuit 140 is enabled to restore the data of the NVM element 130 to the logic memory circuit 110.

Figure 4:
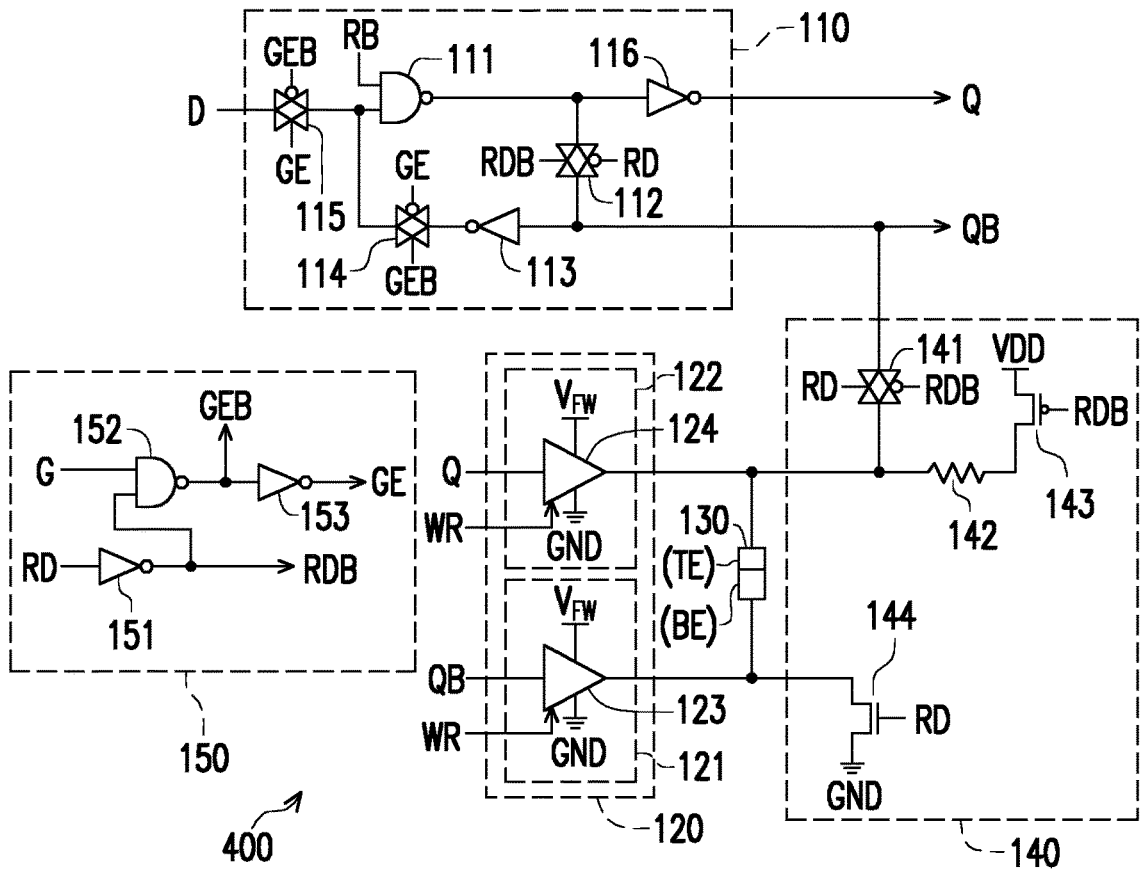
FIG. 4 illustrates a schematic circuit block diagram of a non-volatile memory device according to another embodiment of the disclosure.

FIG. 4 illustrates a schematic circuit block diagram of an NVM device 400 according to another embodiment of the disclosure. The NVM device 400 includes the logic memory circuit 110, the write circuit 120, the NVM element 130, the read circuit 140, and a control circuit 150. The logic memory circuit 110, the write circuit 120, the NVM element 130 and the read circuit 140 shown in FIG. 4 may be deduced by analogy with reference to related descriptions of FIG. 1 to FIG. 3.

In the embodiment shown in FIG. 4, the control circuit 150 includes a NOT gate 151, a NAND gate 152 and a NOT gate 153. An input terminal of the NOT gate 151 may receive a first read signal RD from a front stage circuit (for example, a controller, which is not illustrated). An output terminal of the NOT gate 151 provides a second read signal RDB to the logic memory circuit 110 and the read circuit 140, wherein the second read signal RDB is an inversion signal of the first read signal RD. A first input terminal of the NAND gate 152 may receive an original gate signal G from the front stage circuit (for example, the controller, which is not illustrated). A second input terminal of the NAND gate 152 is coupled to the output terminal of the NOT gate 151 to receive the second read signal RDB. An output terminal of the NAND gate 152 provides a second gate signal GEB to the logic memory circuit 110. An input terminal of the NOT gate 153 is coupled to the output terminal of the NAND gate 152 to receive the second gate signal GEB. An output terminal of the NOT gate 153 provides a first gate signal GE to the logic memory circuit 110, wherein the first gate signal GE is an inversion signal of the second gate signal GEB.

In the embodiment shown in FIG. 4, the logic memory circuit 110 includes a NAND gate 111, a transmission gate 112, a NOT gate 113, a transmission gate 114, a transmission gate 115 and a NOT gate 116. A P-channel gate of the transmission gate 115 is controlled by the second gate signal GEB. An N-channel gate of the transmission gate 115 is controlled by the first gate signal GE. A first terminal of the transmission gate 115 serves as the input terminal D of the logic memory circuit 110. A second terminal of the transmission gate 115 is coupled to a second input terminal of the NAND gate 111. A first input terminal of the NAND gate 111 may receive a reset signal RB from the front stage circuit (for example, the controller, which is not illustrated). An input terminal of the NOT gate 116 is coupled to an output terminal of the NAND gate 111. An output terminal of the NOT gate 116 serves as the output terminal Q of the logic memory circuit 110.

A first terminal of the transmission gate 112 is coupled to the output terminal of the NAND gate 111. A second terminal of the transmission gate 112 is coupled to the output terminal QB of the logic memory circuit 110. A P-channel gate of the transmission gate 112 is controlled by the first read signal RD. An N-channel gate of the transmission gate 112 is controlled by the second read signal RDB. The transmission gate 112 is turned on during the normal operation period and the writing period. The transmission gate 112 is turned off during the reading period. An input terminal of the NOT gate 113 is coupled to the second terminal of the transmission gate 112. A first terminal of the transmission gate 114 is coupled to an output terminal of the NOT gate 113. A second terminal of the transmission gate 114 is coupled to the second input terminal of the NAND gate 111. A P-channel gate of the transmission gate 114 is controlled by the first gate signal GE. An N-channel gate of the transmission gate 114 is controlled by the second gate signal GEB.

In the embodiment shown in FIG. 4, the write circuit 120 includes a first level shifter 121 and a second level shifter 122. An input terminal of the first level shifter 121 is coupled to the output terminal QB of the logic memory circuit 110. An output terminal of the first level shifter 121 serves as the second output terminal of the write circuit 120 to be coupled to the second terminal (for example, the bottom electrode BE) of the NVM element 130. An enable-control terminal of the first level shifter 121 may receive a write signal WR from the front stage circuit (for example, the controller, which is not illustrated). The first level shifter 121 is controlled by the write signal WR. When the write signal WR is in a first logic state (for example, logic "0"), the output terminal of the first level shifter 121 is disabled. When the write signal WR is in a second logic state (for example, logic "1"), the output terminal of the first level shifter 121 decides to output a high write voltage (for example, a forming voltage $V_{FW}$) or a low write voltage (for example, a ground voltage GND) according to a signal at the output terminal QB of the logic memory circuit 110. A voltage difference between the high write voltage and the low write voltage is greater than a threshold voltage of the NVM element 130 (for example, greater than an absolute value of the set voltage VSET shown in FIG. 2, and/or greater than an absolute value of the reset voltage VRESET shown in FIG. 2).

An input terminal of the second level shifter 122 is coupled to the output terminal Q of the logic memory circuit 110. An output terminal of the second level shifter 122 serves as the first output terminal of the write circuit 120 to be coupled to the first terminal (for example, the top electrode TE) of the NVM element 130. An enable-control terminal of the second level shifter 122 may receive the write signal WR from the front stage circuit (for example, the controller, which is not illustrated). The second level shifter 122 is controlled by the write signal WR. When the write signal WR is in the first logic state (for example, logic "0"), the output terminal of the second level shifter 122 is disabled. When the write signal WR is in the second logic state (for example, logic "1"), the output terminal of the second level shifter 122 decides to output the high write voltage (for example, the forming voltage $V_{FW}$) or the low write voltage (for example, the ground voltage GND) according to a signal at the output terminal Q of the logic memory circuit 110.

For example, if the signal at the output terminal Q of the logic memory circuit 110 is logic "1" (i.e., the signal at the output terminal QB is logic "0") and the write signal WR is in the second logic state (for example, logic "1"), the first level shifter 121 may change the signal at the output terminal Q to the high write voltage (for example, the forming voltage $V_{FW}$) during the writing period, and the second level shifter 122 may change the signal at the output terminal QB to the low write voltage (for example, the ground voltage GND) during the writing period. The high write voltage is transmitted to the first terminal (for example, the top electrode TE) of the NVM element 130, and the low write voltage is transmitted to the second terminal (for example, the bottom electrode BE) of the NVM element 130. Accordingly, the resistance state of the NVM element 130 is set to the low resistance state LRS. By analogy, when the signal at the output terminal Q of the logic memory circuit 110 is logic "0" (i.e., the signal at the output terminal QB is logic "1"), the resistance state of the NVM element 130 is then reset to the high resistance state HRS during the writing period.

The write circuit 120 is not implemented only thorough the first level shifter 121 and the second level shifter 122. For example, in another embodiment, the write circuit 120 includes a first buffer 123 and a second buffer 124. An input terminal of the first buffer 123 is coupled to the output terminal QB of the logic memory circuit 110. An output terminal of the first buffer 123 serves as the second output terminal of the write circuit 120 to be coupled to the second terminal (for example, the bottom electrode BE) of the NVM element 130. A power terminal of the first buffer 123 is coupled to the high write voltage (for example, the forming voltage $V_{FW}$). A reference voltage terminal of the first buffer 123 is coupled to the low write voltage (for example, the ground voltage GND). A voltage difference between the forming voltage $V_{FW}$ and the ground voltage GND is greater than the threshold voltage of the NVM element 130 (for example, greater than the absolute value of the set voltage VSET shown in FIG. 2, and/or greater than the absolute value of the reset voltage VRESET shown in FIG. 2). An enable-control terminal of the first buffer 123 may receive the write signal WR from the front stage circuit (for example, the controller, which is not illustrated). The first buffer 123 is controlled by the write signal WR to decide whether to disable the output terminal of the first buffer 123.

An input terminal of the second buffer 124 is coupled to the output terminal Q of the logic memory circuit 110. An output terminal of the second buffer 124 serves as the first output terminal of the write circuit 120 to be coupled to the first terminal (for example, the top electrode TE) of the NVM element 130. A power terminal of the second buffer 124 is coupled to the high write voltage (for example, the forming voltage $V_{FW}$). A reference voltage terminal of the second buffer 124 is coupled to the low write voltage (for example, the ground voltage GND). An enable-control terminal of the second buffer 124 may receive the write signal WR from the front stage circuit (for example, the controller, which is not illustrated). The second buffer 124 is controlled by the write signal WR to decide whether to disable the output terminal of the second buffer 124.

If the signal at the output terminal Q of the logic memory circuit 110 is logic "1" (i.e., the signal at the output terminal QB is logic "0") and the write signal WR is in the second logic state (for example, logic "1"), the first buffer 123 may change the signal at the output terminal Q to the high write voltage (for example, the forming voltage $V_{FW}$) during the writing period, and the second buffer 124 may change the signal at the output terminal QB to the low write voltage (for example, the ground voltage GND) during the writing period. Therefore, when the signal at the output terminal Q of the logic memory circuit 110 is logic "1" (i.e., the signal at the output terminal QB is logic "0"), the resistance state of the NVM element 130 is set to the low resistance state LRS. By analogy, when the signal at the output terminal Q of the logic memory circuit 110 is logic "0" (i.e., the signal at the output terminal QB is logic "1"), the resistance state of the NVM element 130 is then reset to the high resistance state HRS during the writing period.

In the embodiment shown in FIG. 4, the read circuit 140 includes a switch 141, a resistor 142, a switch 143 and a switch 144. A first terminal of the switch 141 serves as the output terminal of the read circuit 140 to be coupled to the output terminal QB of the logic memory circuit 110. A second terminal of the switch 141 serves as the first input terminal of the read circuit 140 to be coupled to the first terminal (for example, the top electrode TE) of the NVM element 130. The switch 141 is controlled by the first read signal RD. The switch 141 is turned off during the normal operation period and the writing period. The switch 141 is turned on during the reading period. The switch 141 may be a transmission gate (or other switch elements/circuits), wherein a P-channel gate of the transmission gate is controlled by the second read signal RDB, and an N-channel gate of the transmission gate is controlled by the first read signal RD.

A first terminal of the resistor 142 is coupled to the second terminal of the switch 141. A first terminal of the switch 143 is coupled to a second terminal of the resistor 142. A second terminal of the switch 143 is coupled to a system voltage VDD. A control terminal of the switch 143 is controlled by the second read signal RDB. The switch 143 is turned off during the normal operation period and the writing period. The switch 143 is turned on during the reading period. The switch 143 may be a P-channel metal oxide semiconductor (PMOS) transistor (or other switch elements/circuits), wherein a gate of the PMOS transistor is controlled by the second read signal RDB, as shown in FIG. 4. A first terminal of the switch 144 serves as the second input terminal of the read circuit 140 to be coupled to the second terminal (for example, the bottom electrode BE) of the NVM element 130. A second terminal of the switch 144 is coupled to a reference voltage (for example, the ground voltage GND). A control terminal of the switch 144 is controlled by the first read signal RD. The switch 144 is turned off during the normal operation period and the writing period. The switch 144 is turned on during the reading period. The switch 144 may be an N-channel metal oxide semiconductor (NMOS) transistor (or other switch elements/circuits), wherein a gate of the NMOS transistor is controlled by the first read signal RD, as shown in FIG. 4.

The switch 141, the switch 143 and the switch 144 are turned on during the reading period. If the resistance state of the NVM element 130 is the low resistance state LRS (equivalent to logic "1"), a resistor string formed by the resistor 142 and the NVM element 130 may provide a divided voltage (a logic low voltage) to the switch 141. The switch 141 may restore the logic low voltage (equivalent to logic "0") to the logic memory circuit 110 via the output terminal QB of the logic memory circuit 110. Therefore, after the reading period ends, the signal at the output terminal QB of the logic memory circuit 110 is restored to logic "0" (i.e., the signal at the output terminal Q is restored to logic "1"). If the resistance state of the NVM element 130 is the high resistance state HRS (equivalent to logic "0"), the resistor string formed by the resistor 142 and the NVM element 130 may provide a divided voltage (a logic high voltage) to the switch 141. The switch 141 may restore the logic high voltage (equivalent to logic "1") to the logic memory circuit 110 via the output terminal QB of the logic memory circuit 110. Therefore, after the reading period ends, the signal at the output terminal QB of the logic memory circuit 110 is restored to logic "1" (i.e., the signal at the output terminal Q is restored to logic "0"). After the aforesaid reading period ends, the logic memory circuit 110 may perform normal operations.

Figure 5:
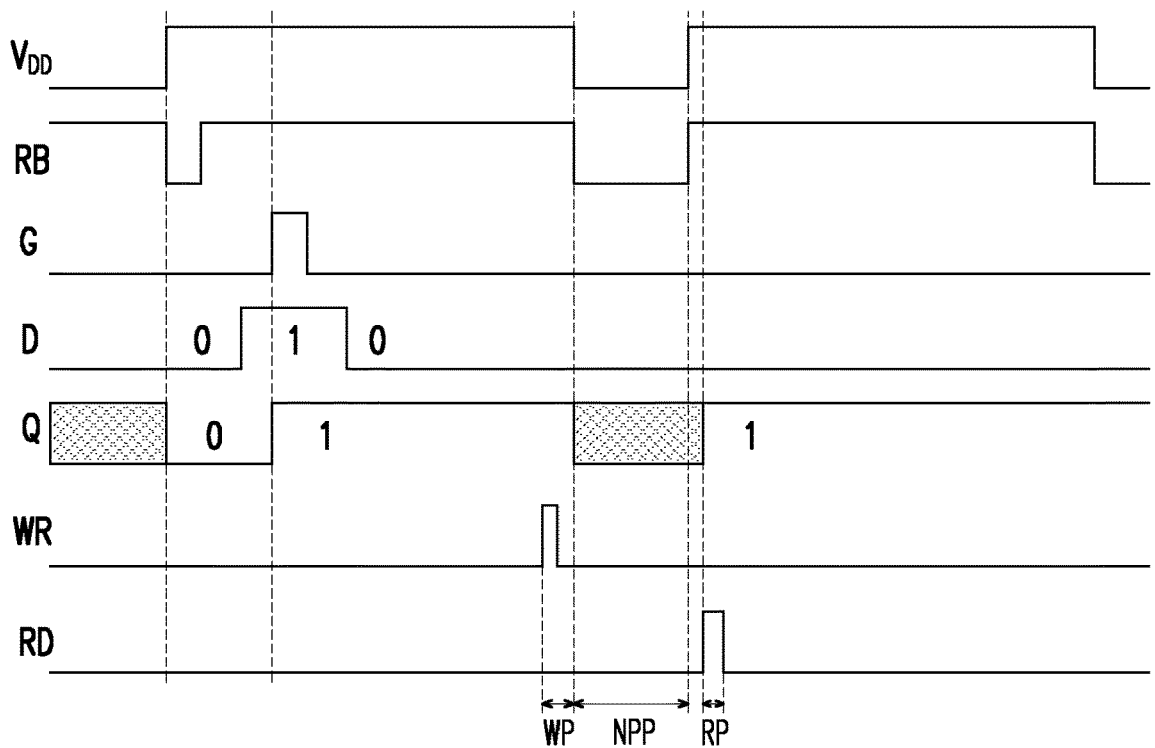
FIG. 5 is a schematic signal timing diagram illustrating the circuit shown in FIG. 4 according to an embodiment of the disclosure.

FIG. 5 is a schematic signal timing diagram illustrating the circuit shown in FIG. 4 according to an embodiment of the disclosure. In FIG. 5, a horizontal axis indicates time and a vertical axis indicates voltage. As shown in FIG. 5, before the storing procedure (a writing period WP), the output terminal Q of the logic memory circuit 110 is at a high voltage level (for example, logic " "); that is, the output terminal QB of the logic memory circuit 110 is logic "0." Before the system enters the standby or shutdown (power-off) mode, the NVM device 400 first performs the storing procedure (the writing period WP) to record the information/data of the logic memory circuit 110 into the NVM element 130. During the writing period WP, the write signal WR is pulled up to the high voltage level (for example, logic "1"), such that the second buffer 124 may change the signal (logic "1") at the output terminal Q to the high write voltage (for example, the forming voltage $V_{FW}$), and the first buffer 123 may change the signal (logic "0") at the output terminal QB to the low write voltage (for example, the ground voltage GND). Meanwhile, a current provided by the second buffer 124 flows from the top electrode TE of the NVM element 130 to the bottom electrode BE of the NVM element 130, so that the resistance state of the NVM element 130 is set to the low resistance state LRS.

After the storing procedure (the writing period WP) is completed, the NVM device 400 may enter a no power-supply period NPP. During the no power-supply period NPP, the system may stop supplying power to the logic memory circuit 110, the write circuit 120 and the read circuit 140, so as to reduce power consumption. At this point, the NVM device 400 has entered the standby or shutdown state/mode.

When the no power-supply period NPP ends, the system may resume supplying power to the logic memory circuit 110, the write circuit 120 and the read circuit 140. After the no power-supply period NPP ends, the NVM device 400 may perform the restoring procedure (entering a reading period RP) to write the information stored in the NVM element 130 back to the logic memory circuit 110. In the restoring procedure, a read signal RD is pulled up to the high voltage level (for example, logic "1"), so that the switch 141, the switch 143 and the switch 144 are turned on. Since the resistance state of the NVM element 130 is the low resistance state LRS (equivalent to logic "1"), the voltage at the output terminal QB of the logic memory circuit 110 is pulled down, so that the output terminal Q of the logic memory circuit 110 outputs the high voltage level (equivalent to logic "1"). Therefore, after the reading period RP ends, the signal at the output terminal QB of the logic memory circuit 110 is restored to logic "0;" that is, the signal at the output terminal Q is restored to logic "1."

Figure 6:
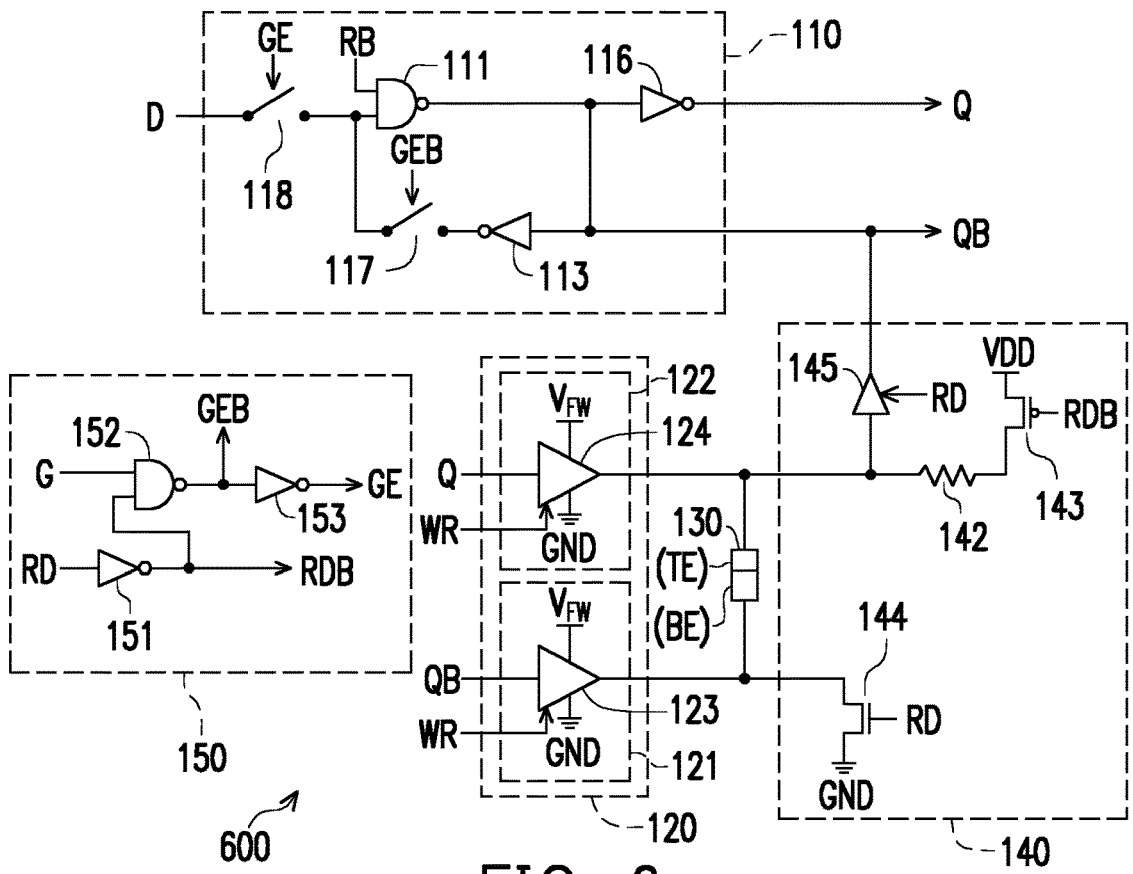
FIG. 6 illustrates a schematic circuit block diagram of a non-volatile memory device according to still another embodiment of the disclosure.

FIG. 6 illustrates a schematic circuit block diagram of an NVM device 600 according to still another embodiment of the disclosure. The NVM device 600 includes the logic memory circuit 110, the write circuit 120, the NVM element 130, the read circuit 140 and the control circuit 150. The logic memory circuit 110, the write circuit 120, the NVM element 130 and the read circuit 140 shown in FIG. 6 may be deduced by analogy with reference to related descriptions of FIG. 1 to FIG. 3. The write circuit 120, the NVM element 130, the read circuit 140 and the control circuit 150 shown in FIG. 6 may be understood with reference to related descriptions of FIG. 4, and the details thereof are thus omitted.

Referring to FIG. 6, the logic memory circuit 110 includes the NAND gate 111, the NOT gate 113, the NOT gate 116, a switch 117 and a switch 118. The switch 118 is controlled by a gate signal GE. A first terminal of the switch 118 serves as the input terminal D of the logic memory circuit 110. A second terminal of the switch 118 is coupled to the second input terminal of the NAND gate 111. The first input terminal of the NAND gate 111 is coupled to the reset signal RB. The input terminal of the NOT gate 116 is coupled to the output terminal of the NAND gate 111. The output terminal of the NOT gate 116 serves as the output terminal Q of the logic memory circuit 110. The output terminal of the NAND gate 111 is coupled to the output terminal QB of the logic memory circuit 110. The input terminal of the NOT gate 113 is coupled to the output terminal of the NAND gate 111. A first terminal of the switch 117 is coupled to the output terminal of the NOT gate 113. A second terminal of the switch 117 is coupled to the second input terminal of the NAND gate 111. The switch 117 is controlled by a gate signal GEB.

In the embodiment shown in FIG. 6, the read circuit 140 includes the resistor 142, the switch 143, the switch 144 and a buffer 145. An output terminal of the buffer 145 serves as the output terminal of the read circuit 140 to be coupled to the output terminal QB of the logic memory circuit 110. An input terminal of the buffer 145 serves as the first input terminal of the read circuit 140 to be coupled to the first terminal (for example, the top electrode TE) of the NVM element 130. The buffer 145 is controlled by the first read signal RD. The buffer 145 is disabled during the normal operation period and the writing period. The buffer 145 is enabled during the reading period. The first terminal of the resistor 142 is coupled to the input terminal of the buffer 145. The first terminal of the switch 143 is coupled to the second terminal of the resistor 142. The second terminal of the switch 143 is coupled to the system voltage VDD. The control terminal of the switch 143 is controlled by the second read signal RDB. The first terminal of the switch 144 serves as the second input terminal of the read circuit 140 to be coupled to the second terminal (for example, the bottom electrode BE) of the NVM element 130. The second terminal of the switch 144 is coupled to the reference voltage (for example, the ground voltage GND). The control terminal of the switch 144 is controlled by the first read signal RD. The switch 143 and the switch 144 are turned off during the normal operation period and the writing period. The switch 143 and the switch 144 are turned on during the reading period.

The buffer 145 is enabled and the switch 143 and the switch 144 are turned on during the reading period. If the resistance state of the NVM element 130 is the low resistance state LRS (equivalent to logic "1"), the resistor string formed by the resistor 142 and the NVM element 130 may provide a divided voltage (the logic low voltage) to the buffer 145. The buffer 145 may restore the logic low voltage (equivalent to logic "0") to the logic memory circuit 110 via the output terminal QB of the logic memory circuit 110. Therefore, after the reading period ends, the signal at the output terminal QB of the logic memory circuit 110 is restored to logic "0" (i.e., the signal at the output terminal Q is restored to logic "1"). If the resistance state of the NVM element 130 is the high resistance state HRS (equivalent to logic "0"), the resistor string formed by the resistor 142 and the NVM element 130 may provide a divided voltage (the logic high voltage) to the buffer 145. The buffer 145 may restore the logic high voltage (equivalent to logic "1") to the logic memory circuit 110 via the output terminal QB of the logic memory circuit 110. Therefore, after the reading period ends, the signal at the output terminal QB of the logic memory circuit 110 is restored to logic "1" (i.e., the signal at the output terminal Q is restored to logic "0"). After the aforesaid reading period ends, the logic memory circuit 110 may perform normal operations.

Figure 7:
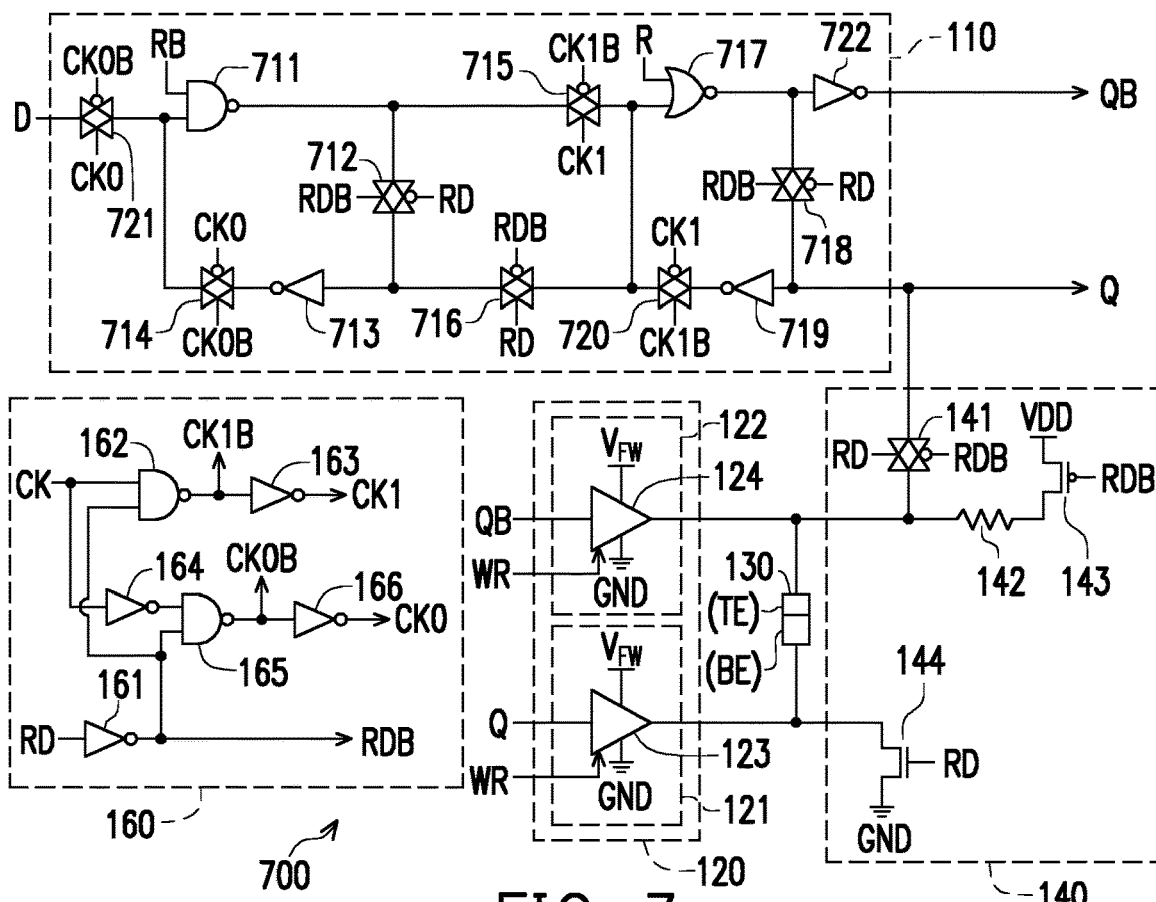
FIG. 7 illustrates a schematic circuit block diagram of a non-volatile memory device according to yet still another embodiment of the disclosure.

FIG. 7 illustrates a schematic circuit block diagram of an NVM device 700 according to yet still another embodiment of the disclosure. The NVM device 700 includes the logic memory circuit 110, the write circuit 120, the NVM element 130, the read circuit 140 and a control circuit 160. The logic memory circuit 110, the write circuit 120, the NVM element 130 and the read circuit 140 shown in FIG. 7 may be deduced by analogy with reference to related descriptions of FIG. 1 to FIG. 3. The write circuit 120, the NVM element 130 and the read circuit 140 shown in FIG. 7 may be understood with reference to related descriptions of FIG. 4, and the details thereof are thus omitted.

In the embodiment shown in FIG. 7, the control circuit 160 includes a NOT gate 161, a NAND gate 162, a NOT gate 163, a NOT gate 164, a NAND gate 165 and a NOT gate 166. An input terminal of the NOT gate 161 may receive the first read signal RD from the front stage circuit (for example, the controller, which is not illustrated). An output terminal of the NOT gate 161 provides the second read signal RDB to the logic memory circuit 110 and the read circuit 140, wherein the second read signal RDB is an inversion signal of the first read signal RD. A first input terminal of the NAND gate 162 may receive an original clock signal CK from the front stage circuit (for example, the controller, which is not illustrated). A second input terminal of the NAND gate 162 is coupled to the output terminal of the NOT gate 161 to receive the second read signal RDB. An output terminal of the NAND gate 162 provides a clock signal CK1B to the logic memory circuit 110. An input terminal of the NOT gate 163 is coupled to the output terminal of the NAND gate 162 to receive the clock signal CK1B. An output terminal of the NOT gate 163 provides a clock signal CK1 to the logic memory circuit 110, wherein the clock signal CK1 is an inversion signal of the clock signal CK1B. An input terminal of the NOT gate 164 receives the original clock signal CK. A first input terminal of the NAND gate 165 is coupled to an output terminal of the NOT gate 164. A second input terminal of the NAND gate 165 is coupled to the output terminal of the NOT gate 161 to receive the second read signal RDB. An output terminal of the NAND gate 165 provides a clock signal CK0B to the logic memory circuit 110. An input terminal of the NOT gate 166 is coupled to the output terminal of the NAND gate 165 to receive the clock signal CK0B. An output terminal of the NOT gate 166 provides a clock signal CK0 to the logic memory circuit 110.

In the embodiment shown in FIG. 7, the logic memory circuit 110 includes a NAND gate 711, a transmission gate 712, a NOT gate 713, a transmission gate 714, a transmission gate 715, a transmission gate 716, a NOR gate 717, a transmission gate 718, a NOT gate 719, a transmission gate 720, a transmission gate 721 and a NOT gate 722. A P-channel gate of the transmission gate 721 is controlled by the clock signal CK0B. An N-channel gate of the transmission gate 721 is controlled by the clock signal CK0. A first terminal of the transmission gate 721 serves as the input terminal D of the logic memory circuit 110. A second terminal of the transmission gate 721 is coupled to a second input terminal of the NAND gate 711. A first input terminal of the NAND gate 711 may receive the reset signal RB from the front stage circuit (for example, the controller, which is not illustrated). A first terminal of the transmission gate 712 is coupled to an output terminal of the NAND gate 711. A P-channel gate of the transmission gate 712 is controlled by the first read signal RD. An N-channel gate of the transmission gate 712 is controlled by the second read signal RDB. The transmission gate 712 is turned on during the normal operation period and the writing period. The transmission gate 712 is turned off during the reading period. An input terminal of the NOT gate 713 is coupled to a second terminal of the transmission gate 712. A first terminal of the transmission gate 714 is coupled to an output terminal of the NOT gate 713. A second terminal of the transmission gate 714 is coupled to a second input terminal of the NAND gate 711. A P-channel gate of the transmission gate 714 is controlled by the clock signal CK0. An N-channel gate of the transmission gate 714 is controlled by the clock signal CK0B.

A first terminal of the transmission gate 715 is coupled to the output terminal of the NAND gate 711. An N-channel gate of the transmission gate 715 is controlled by the clock signal CK1. A P-channel gate of the transmission gate 715 is controlled by the clock signal CK1B. A first terminal of the transmission gate 716 is coupled to the input terminal of the NOT gate 713. An N-channel gate of the transmission gate 716 is controlled by the first read signal RD. A P-channel gate of the transmission gate 716 is controlled by the second read signal RDB. The transmission gate 716 is turned off during the normal operation period and the writing period. The transmission gate 716 is turned on during the reading period. A first input terminal of the NOR gate 717 may receive a reset signal R from the front stage circuit (for example, the controller, which is not illustrated), wherein the reset signal R is an inversion signal of the reset signal RB. A second input terminal of the NOR gate 717 is coupled to a second terminal of the transmission gate 715. An input terminal of the NOT gate 722 is coupled to an output terminal of the NOR gate 717. An output terminal of the NOT gate 722 serves as the output terminal QB of the logic memory circuit 110. A first terminal of the transmission gate 718 is coupled to the output terminal of the NOR gate 717. A second terminal of the transmission gate 718 is coupled to the output terminal Q of the logic memory circuit 110. A P-channel gate of the transmission gate 718 is controlled by the first read signal RD. An N-channel gate of the transmission gate 718 is controlled by the second read signal RDB. The transmission gate 718 is turned on during the normal operation period and the writing period. The transmission gate 718 is turned off during the reading period. An input terminal of the NOT gate 719 is coupled to the second terminal of the transmission gate 718. A first terminal of the transmission gate 720 is coupled to an output terminal of the NOT gate 719. A second terminal of the transmission gate 720 is coupled to the second input terminal of the NOR gate 717 and a second terminal of the transmission gate 716. A P-channel gate of the transmission gate 720 is controlled by the clock signal CK1. An N-channel gate of the transmission gate 720 is controlled by the clock signal CK1B.

In the embodiment shown in FIG. 7, the write circuit 120 includes the first level shifter 121 and the second level shifter 122. The input terminal of the first level shifter 121 is coupled to the output terminal Q of the logic memory circuit 110. The output terminal of the first level shifter 121 serves as the second output terminal of the write circuit 120 to be coupled to the second terminal (for example, the bottom electrode BE) of the NVM element 130. The input terminal of the second level shifter 122 is coupled to the output terminal QB of the logic memory circuit 110. The output terminal of the second level shifter 122 serves as the first output to al of the write circuit 120 to be coupled to the first terminal (for example, the top electrode TE) of the NVM element 130.

The write circuit 120 is not implemented only thorough the first level shifter 121 and the second level shifter 122. For example, in another embodiment, the write circuit 120 includes the first buffer 123 and the second buffer 124. In the embodiment shown in FIG. 7, the input terminal of the first buffer 123 is coupled to the output terminal Q of the logic memory circuit 110. The output terminal of the first buffer 123 serves as the second output terminal of the write circuit 120 to be coupled to the second terminal (for example, the bottom electrode BE) of the NVM element 130. The input terminal of the second buffer 124 is coupled to the output terminal QB of the logic memory circuit 110. The output terminal of the second buffer 124 serves as the first output terminal of the write circuit 120 to be coupled to the first terminal (for example, the top electrode TE) of the NVM element 130.

In the embodiment shown in FIG. 7, the read circuit 140 includes the switch 141, the resistor 142, the switch 143 and the switch 144. The first terminal of the switch 141 serves as the output terminal of the read circuit 140 to be coupled to the output terminal Q of the logic memory circuit 110. The second terminal of the switch 141 serves as the first input terminal of the read circuit 140 to be coupled to the first terminal (for example, the top electrode TE) of the NVM element 130. The first terminal of the resistor 142 is coupled to the second terminal of the switch 141. The first terminal of the switch 143 is coupled to the second terminal of the resistor 142. The second terminal of the switch 143 is coupled to the system voltage VDD. The first terminal of the switch 144 serves as the second input terminal of the read circuit 140 to be coupled to the second terminal (for example, the bottom electrode BE) of the NVM element 130. The second terminal of the switch 144 is coupled to the reference voltage (for example, the ground voltage GND).

Figure 8:
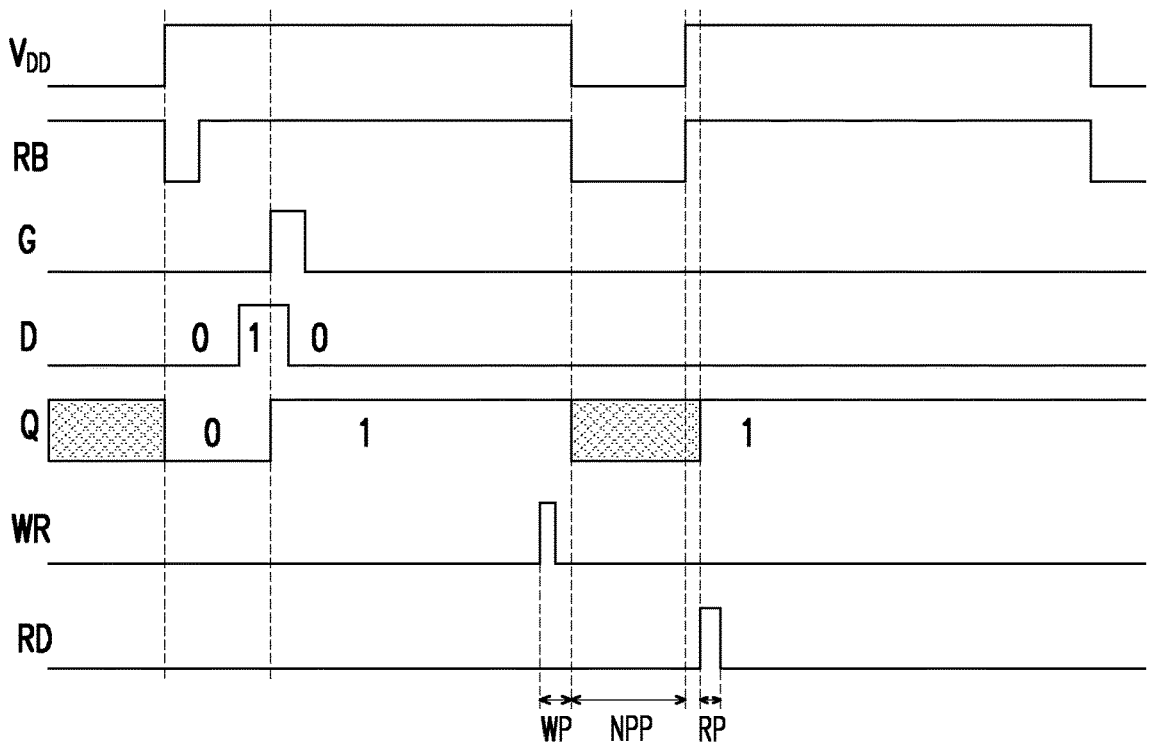
FIG. 8 is a schematic signal timing diagram illustrating the circuit shown in FIG. 7 according to an embodiment of the disclosure.

FIG. 8 is a schematic signal timing diagram illustrating the circuit shown in FIG. 7 according to an embodiment of the disclosure. In FIG. 8, a horizontal axis indicates time and a vertical axis indicates voltage. As shown in FIG. 8, before the storing procedure (a writing period WP), the output terminal Q of the logic memory circuit 110 is at a high voltage level (for example, logic "1"); that is, the output terminal QB of the logic memory circuit 110 is logic "0." Before the system enters the standby or shutdown (power-off) mode, the NVM device 700 first performs the storing procedure (the writing period WP) to record the information/data of the logic memory circuit 110 into the NVM element 130. During the writing period WP, the write signal WR is pulled up to the high voltage level (for example, logic "1"), such that the first buffer 123 may change the signal (logic "1") at the output terminal Q to the high write voltage (for example, the forming voltage $V_{FW}$), and the second buffer 124 may change the signal (logic "0") at the output terminal QB to the low write voltage (for example, the ground voltage GND). Meanwhile, a current provided by the first buffer 123 flows from the bottom electrode BE of the NVM element 130 to the top electrode TE of the NVM element 130, so that the resistance state of the NVM element 130 is reset to the high resistance state HRS.

After the storing procedure (the writing period WP) is completed, the NVM device 700 may enter the no power-supply period NPP. During the no power-supply period NPP, the system may stop supplying power to the logic memory circuit 110, the write circuit 120 and the read circuit 140, so as to reduce power consumption. At this point, the NVM device 700 has entered the standby or shutdown state/mode.

When the no power-supply period NPP ends, the system may resume supplying power to the logic memory circuit 110, the write circuit 120 and the read circuit 140. After the no power-supply period NPP ends, the NVM device 700 may perform the restoring procedure (entering a reading period RP) to write the information stored in the NVM element 130 back to the logic memory circuit 110. In the restoring procedure, the read signal RD is pulled up to the high voltage level (for example, logic "1"), so that the switch 141, the switch 143 and the switch 144 are turned on. Since the resistance state of the NVM element 130 is the high resistance state HRS (equivalent to logic "1"), the voltage at the output terminal Q of the logic memory circuit 110 is pulled up, so that the output terminal QB of the logic memory circuit 110 outputs the low voltage level (equivalent to logic "0"). Therefore, after the reading period RP ends, the signal at the output terminal Q of the logic memory circuit 110 is restored to logic "1;" that is, the signal at the output terminal QB is restored to logic "0."

Figure 9:
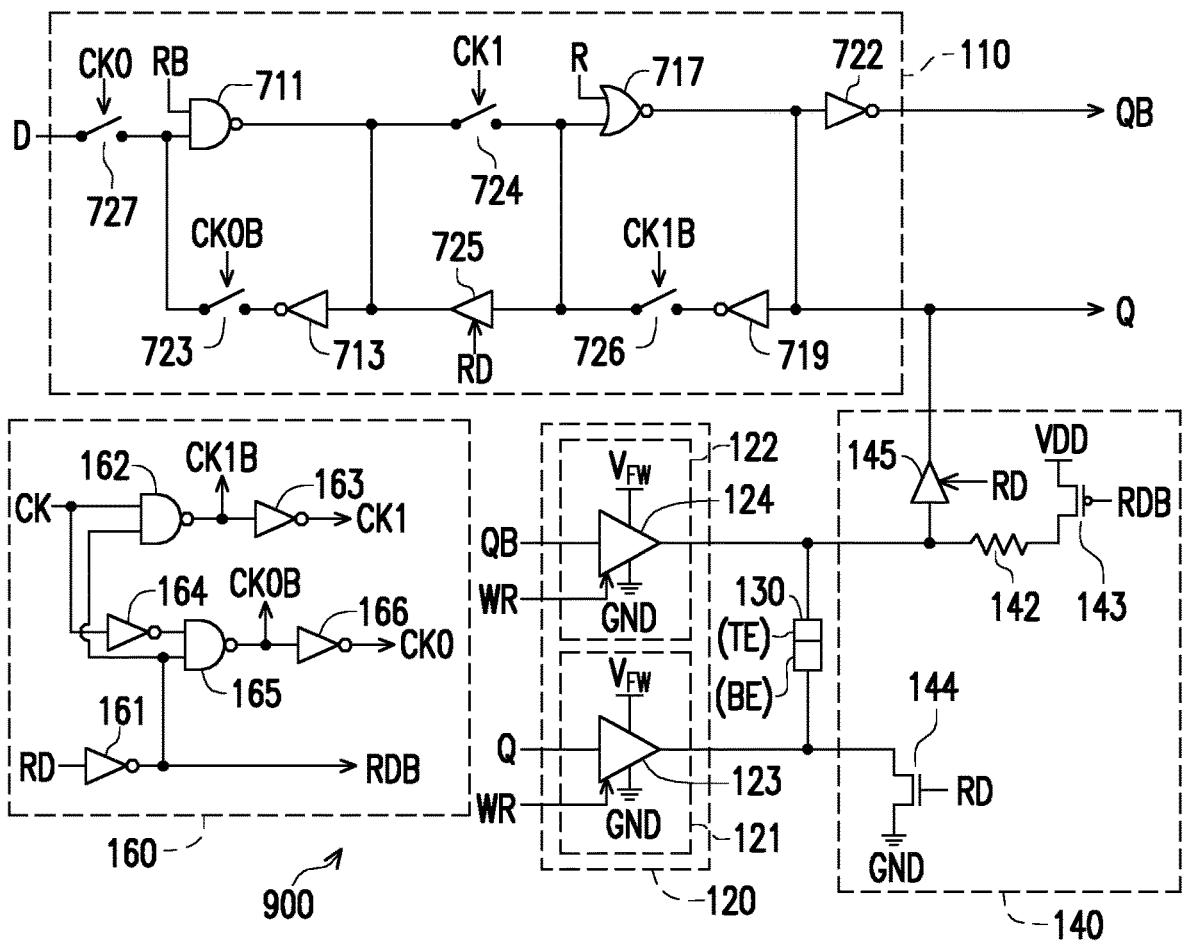
FIG. 9 illustrates a schematic circuit block diagram of a non-volatile memory device according to a further embodiment of the disclosure.

FIG. 9 illustrates a schematic circuit block diagram of an NVM device 900 according to a further embodiment of the disclosure. The NVM device 900 includes the logic memory circuit 110, the write circuit 120, the NVM element 130, the read circuit 140 and the control circuit 160. The logic memory circuit 110, the write circuit 120, the NVM element 130 and the read circuit 140 shown in FIG. 9 may be deduced by analogy with reference to related descriptions of FIG. 1 to FIG. 3. The write circuit 120, the NVM element 130, the read circuit 140 and the control circuit 160 shown in FIG. 9 may be understood with reference to related descriptions of FIG. 7, and the details thereof are thus omitted.

Referring to FIG. 9, the logic memory circuit 110 includes the NAND gate 711, the NOT gate 713, the NOR gate 717, the NOT gate 719, the NOT gate 722, a switch 723, a switch 724, a buffer 725, a switch 726 and a switch 727. A first terminal of the switch 727 serves as the input terminal D of the logic memory circuit 110. A second terminal of the switch 727 is coupled to the second input terminal of the NAND gate 711. The switch 727 is controlled by the clock signal CK0. The first input terminal of the NAND gate 711 is coupled to the reset signal RB. The input terminal of the NOT gate 713 is coupled to the output terminal of the NAND gate 711. A first terminal of the switch 723 is coupled to the output terminal of the NOT gate 713. A second terminal of the switch 723 is coupled to the second input terminal of the NAND gate 711. The switch 723 is controlled by the clock signal CK0B. A first terminal of the switch 724 is coupled to the output terminal of the NAND gate 711. The switch 724 is controlled by the clock signal CK1. An output terminal of the buffer 725 is coupled to the input terminal of the NOT gate 713. The buffer 725 is controlled by the read signal RD.

The first input terminal of the NOR gate 717 is coupled to the reset signal R. The second input terminal of the NOR gate 717 is coupled to a second terminal of the switch 724. The output terminal of the NOR gate 717 is coupled to the output terminal Q of the logic memory circuit 110. The input terminal of the NOT gate 722 is coupled to the output terminal of the NOR gate 717. The output terminal of the NOT gate 722 serves as the output terminal QB of the logic memory circuit 110. The input terminal of the NOT gate 719 is coupled to the output terminal of the NOR gate 717. A first terminal of the switch 726 is coupled to the output terminal of the NOT gate 719. A second terminal of the switch 726 is coupled to the second input terminal of the NOR gate 717 and an input terminal of the buffer 725. The switch 726 is controlled by the clock signal CK1B.

In the embodiment shown in FIG. 9, the read circuit 140 includes the resistor 142, the switch 143, the switch 144 and the buffer 145. The output terminal of the buffer 145 serves as the output terminal of the read circuit 140 to be coupled to the output terminal Q of the logic memory circuit 110. The read circuit 140 shown in FIG. 9 may be deduced by analogy with reference to related descriptions of FIG. 6, and the details thereof are thus omitted.

It should be noted that, under different application scenarios, related functions of the logic memory circuit 110, the write circuit 120 and/or the read circuit 140 described in the foregoing embodiments may be implemented as firmware or hardware by utilizing a common hardware description language (for example, Verilog HDL or VHDL) or other suitable programming languages. The firmware capable of executing the related functions can be arranged into any known computer-accessible media such as magnetic tapes, semiconductor memories, magnetic disks or compact disks (for example, CD-ROM or DVD-ROM); or the firmware may be transmitted via the Internet, wired communication, wireless communication or other communication media. The firmware may be stored in the computer-accessible media, so that a computer processor can access/execute programming codes of the firmware. In addition, the apparatus and method of the disclosure may be implemented by a combination of hardware and software.

Figure 10:
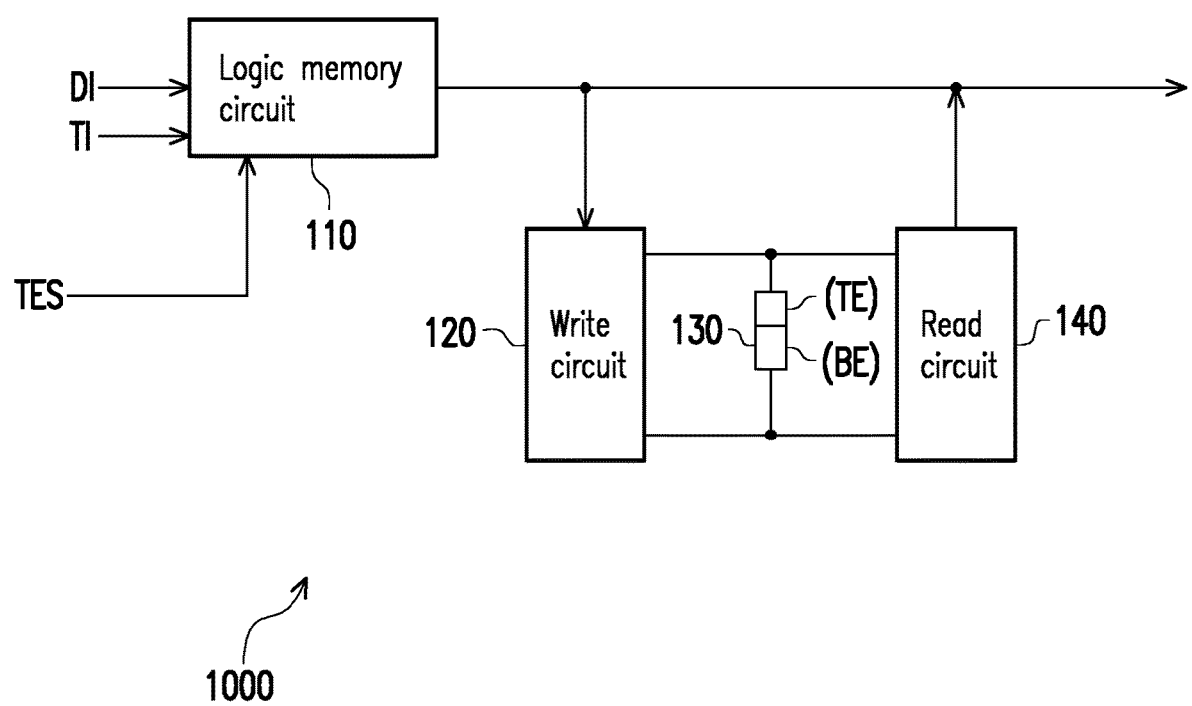
FIG. 10 illustrates a schematic circuit block diagram of an Nth stage non-volatile memory device according to an embodiment of the disclosure.

FIG. 10 illustrates a schematic circuit block diagram of an Nth stage NVM device according to an embodiment of the disclosure. An NVM device 1000 includes the logic memory circuit 110, the write circuit 120, the NVM element 130, and the read circuit 140. The logic memory circuit 110 of the NVM device 1000 has a data input terminal DI and a test input terminal TI. The logic memory circuit 110 may receive external data via the data input terminal DI in a normal mode. The logic memory circuit 110 may also receive test data via the test input terminal TI in a test mode. The write circuit 120 may write the test data or the external data to the NVM element 130 during the writing period. The read circuit 140 may transmit stored data stored in the NVM element 130 to the output terminal of the logic memory circuit 110 via the output terminal of the logic memory circuit 110 during the reading period. In the present embodiment, the NVM device 1000 may further decide to enter the normal mode or the test mode according to a first test enable signal TES.

Figure 11:
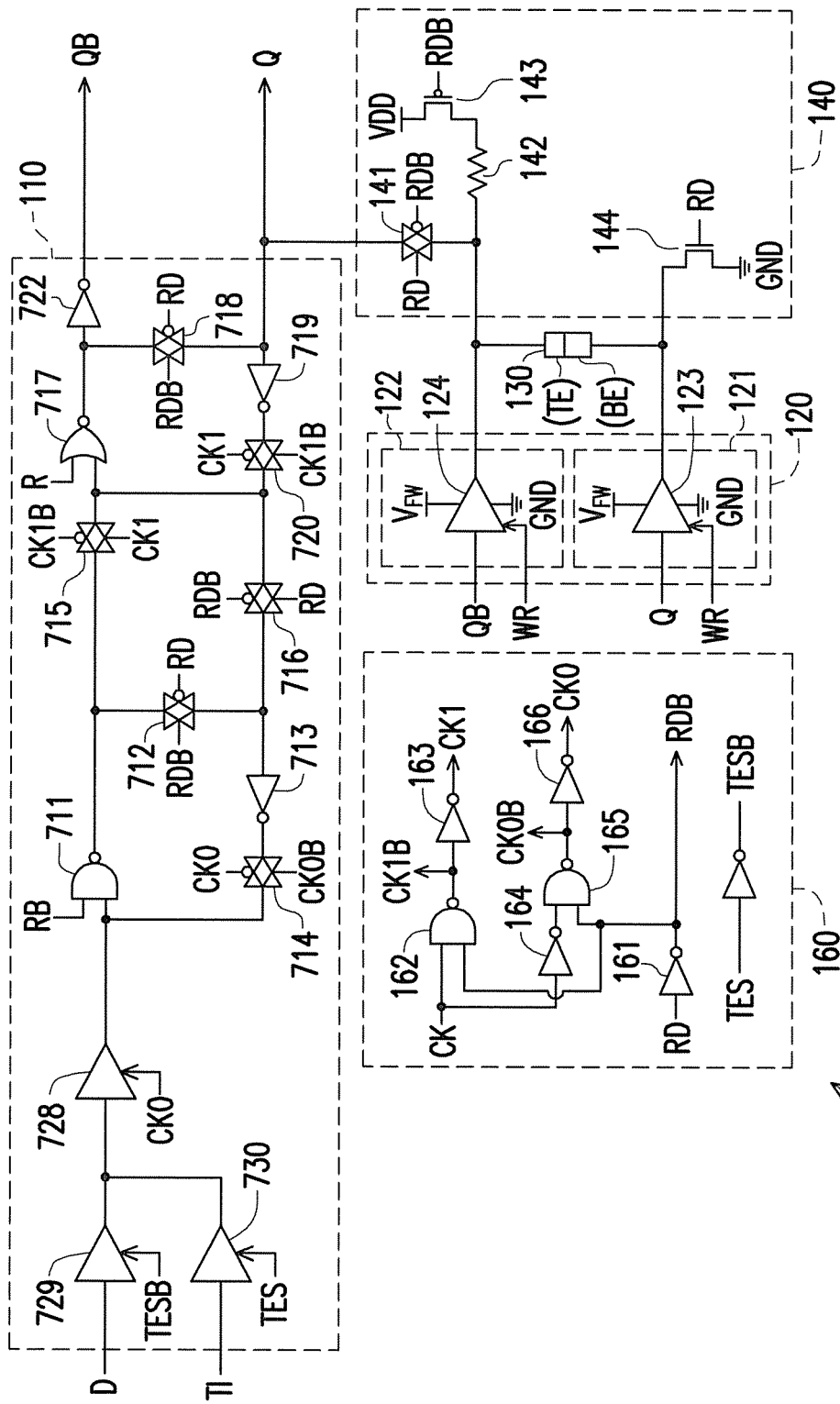
FIG. 11 illustrates a schematic circuit block diagram of a non-volatile memory device according to FIG. 10.

Referring to FIG. 11, FIG. 11 illustrates a schematic circuit block diagram of an NVM device according to FIG. 10. The logic memory circuit 110 of an Nth stage NVM device 1100 includes a first input buffer 728, a second input buffer 729 and a third input buffer 730. The first input buffer 728 is controlled by the clock signal CK0. An input terminal of the second input buffer 729 is configured to receive the test data, an output terminal of the second input buffer 729 is coupled to an output terminal of the first input buffer 728, and the second input buffer 729 is controlled by the first test enable signal TES. An input terminal of the third input buffer 730 is configured to receive digital data, an output terminal of the third input buffer 730 is coupled to the output terminal of the first input buffer 728, and the third input buffer 730 is controlled by a second test enable signal.

In addition, the control circuit 160 of the NVM device 1100 in FIG. 11 further includes a NOT gate 167. An input terminal of the NOT gate 167 is configured to receive the first test enable signal TES. The input terminal of the NOT gate 167 is configured to provide a second test enable signal TESB to the third input buffer 730.

In the embodiment of FIG. 11, the logic memory circuit 110 may receive the test data according to the enabling first test enable signal TES and the clock signal CK0 in the test mode. The logic memory circuit 110 receives the digital data according to the enabling second test enable signal TESB and the clock signal CK0 in the normal mode. The second test enable signal TESB is an inversion signal of the first test enable signal TES.

Figure 12:
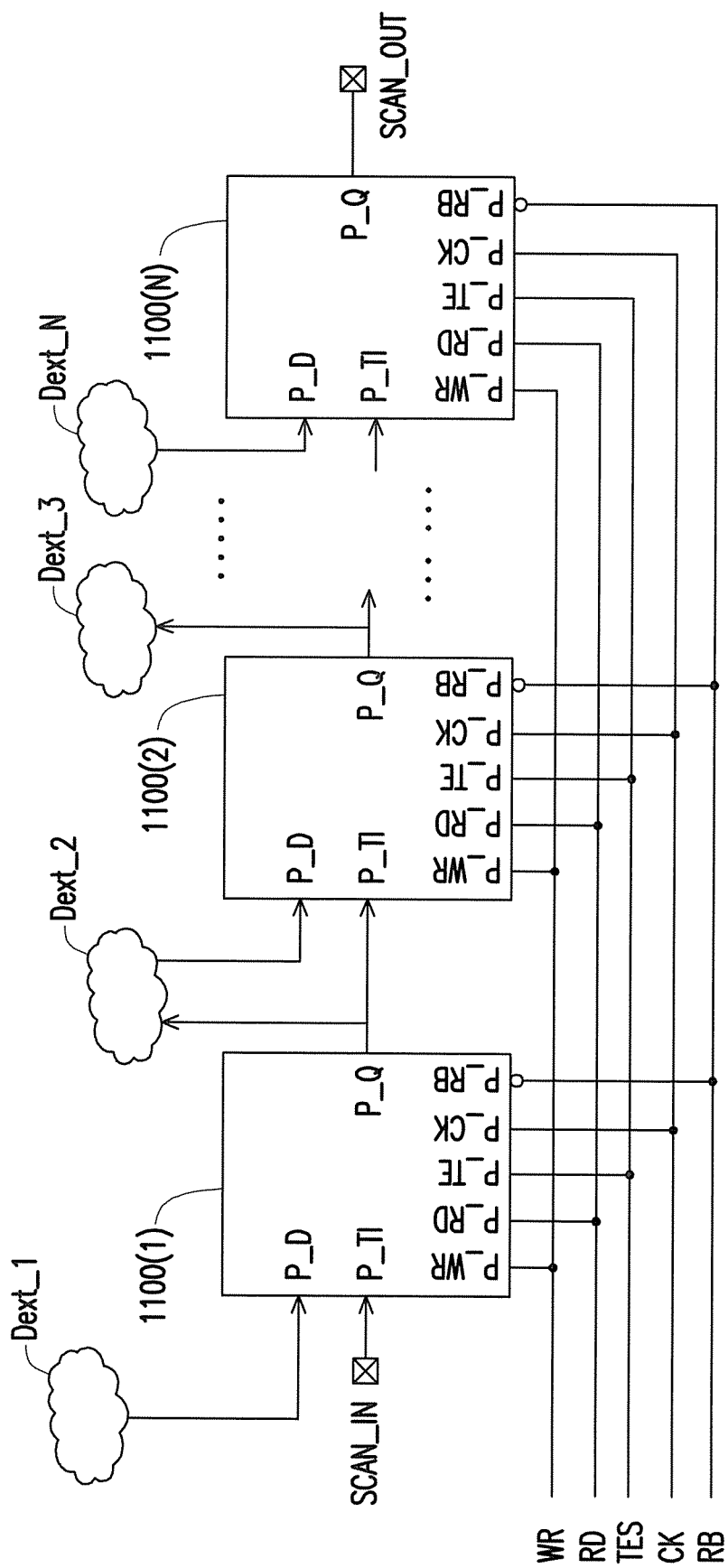
FIG. 12 illustrates a schematic circuit block diagram of a memory circuit according to an embodiment of the disclosure.

Next, an arrangement manner of a memory circuit is described. Referring to FIG. 12, FIG. 12 illustrates a schematic circuit block diagram of a memory circuit according to an embodiment of the disclosure. In the embodiment of FIG. 12, a memory circuit 1200 includes a plurality of NVM devices 1100(1) to 1100(N), wherein the NVM devices 1100(1) to 1100(N) are coupled in series to implement an ATPG testing circuit configuration. In addition, the memory circuit 1200 further includes an input scanning pin pad SCAN_IN and an output scanning pin pad SCAN_OUT. The input scanning pin pad SCAN_IN is coupled to the NVM device 1100(1). The output scanning pin pad SCAN_OUT is coupled to the last stage NVM device 1100(N). In the test mode, the memory circuit 1200 may receive the test data from the outside via the input scanning pin pad SCAN_IN and output the stored data via the output scanning pin pad SCAN_OUT. The internal configuration of the NVM devices 1100(1) to 1100(N) has been described in detail in the embodiments of FIG. 1, FIG. 10 and FIG. 11, and will thus not be repeated herein.

The NVM devices 1100(1) to 1100(E) may jointly receive the write signal WR, the read signal RD, the first test enable signal TES, the original clock signal CK and the reset signal RB via pin pads P_WR, P_RD, P_TES, P_CK and P_RB, respectively. The NVM devices 1100(1) to 1100(N) may receive the external data and the test data via pin pads P_D and P_TI, respectively, and respectively output the stored data stored in the NVM element via a pin pad P_Q.

In the present embodiment, the NVM device 1100(1) may enter the test mode according to the enabling first test enable signal TES, so as to receive the test data from the input scanning pin pad SCAN_IN via the pin pad P_TI. Moreover, the NVM device 1100(1) may enter the normal mode according to the enabling second test enable signal TESB, so as to receive the external data from an external combinational logic circuit Dext_1 via the pin pad P_D. During the writing period, the NVM device 1100(1) writes the test data and the external data to the NVM element, or resets the stored data stored in the NVM element. During the reading period, the NVM device 1100(1) may output the stored data to the next stage NVM device 1100(2) and an external combinational logic circuit Dext_2 via the pin pad P_Q. The next stage NVM device 1100(2) may enter the test mode according to the enabling first test enable signal TES, so as to receive the test data from the NVM device 1100(1) via the pin pad P_TI. Moreover, the NVM device 1100(2) may enter the normal mode according to the enabling second test enable signal TESB, so as to receive the external data from the external combinational logic circuit Dext_2 via the pin pad P_D. During the writing period, the NVM device 1100(1) writes the test data and the external data to the NVM element, or resets the stored data stored in the NVM element. Next, during the reading period, the NVM device 1100(2) may output the stored data to the next stage NVM device and an external combinational logic circuit Dext_3 via the pin pad P_Q, and the rest may be deduced by analogy. The last stage NVM device 1100(N) may enter the test mode according to the enabling first test enable signal TES, so as to receive the test data from the previous state NVM device via the pin pad P_TI. The NVM device 1100(N) may enter the normal mode according to the enabling second test enable signal TESB, so as to receive the external data from an external combinational logic circuit Dext_N via the pin pad P_D. During the reading period, the NVM device 1100(N) outputs the stored data to the output scanning pin pad SCAN_OUT via the pin pad P_Q.

In the normal mode, the memory circuit 1200 that forms the ATPG circuit configuration may receive the external data from the external combinational logic circuits Dext_1 to Dext_N, and then outputs the external data, thereby determining whether the external combinational logic circuits Dext_1 to Dext_N are in normal operation.

It is worth mentioning that, in the test mode, the memory circuit 1200 may receive the test data and write the test data to each of the NVM devices 1100(1) to 1100(N) on a stage-by-stage basis. During the normal operation period, the memory circuit 1200 may test whether the logic memory circuit is in normal operation according to the enabling first test enable signal TES and the reset signal RB. Moreover, during the writing period and the reading period, the memory circuit 1200 may further test whether the NVM element is in normal operation according to the enabling first test enable signal TES and the reset signal RB. In this way, the memory circuit 1200 is capable of inspecting the NVM element therein without requiring an additional external circuit.

Figure 13:
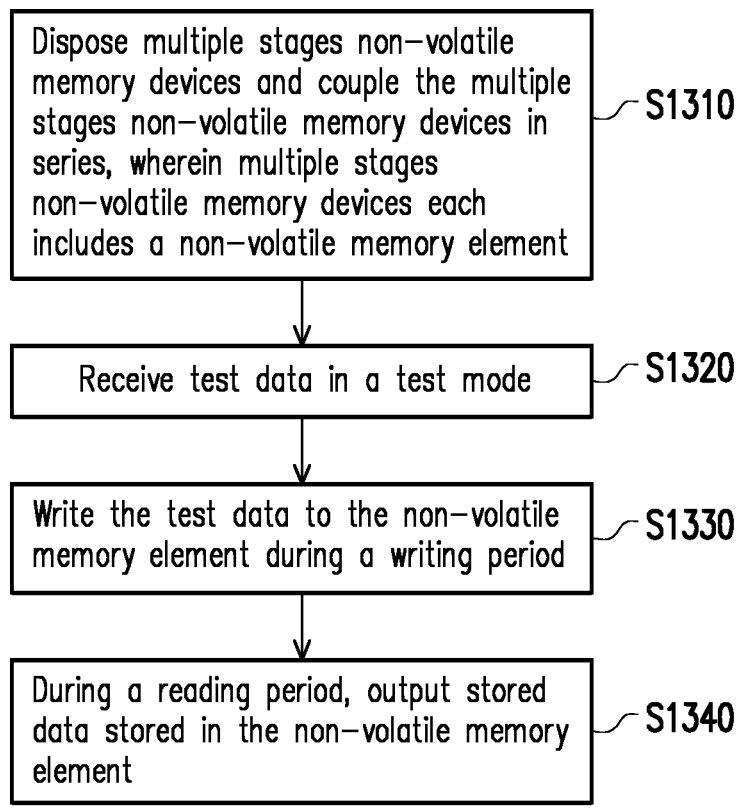
FIG. 13 illustrates a flowchart of a testing method according to an embodiment of the disclosure.

Referring to FIG. 13, FIG. 13 illustrates a flowchart of a testing method according to an embodiment of the disclosure. In step S1310, multiple stage NVM devices are disposed and are coupled in series, wherein the multiple stage NVM devices each include an NVM element. In step S1320, test data is received in a test mode. In step S1330, the test data is written to the NVM element during a writing period. In step S1340, during a reading period, stored data stored in the NVM element is outputted. The implantation details of the above steps S1310 to S1340 have been given in the aforesaid embodiments of FIG. 10 to FIG. 12, and will thus not be repeated herein.

To sum up, in the memory circuit of the disclosure, multiple stage NVM devices are coupled in series to implement an ATPG testing circuit configuration. Additionally, the NVM element, the write circuit and the read circuit are added to realize a low energy consuming ATPG testing circuit. In addition, the logic memory circuit may receive the test data in the test mode, and the write circuit and the read circuit are operated. Accordingly, the memory circuit is capable of inspecting the NVM element therein without requiring an additional external circuit.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A testing method comprising:
disposing multiple stages of non-volatile memory device and coupling the multiple stages of non-volatile memory device in series, wherein the multiple stages of non-volatile memory device each comprises a non-volatile memory element;
receiving test data in a test mode;
writing the test data to a non-volatile memory element of each stage of non-volatile memory device during a writing period; and
during a reading period, outputting stored data stored in the non-volatile memory element of each stage of non-volatile memory device,
wherein the testing method further comprises
receiving external data in a normal mode, and providing the external data by an external combinational logic circuit.

2. The testing method of claim 1, wherein the step of outputting the stored data stored in the non-volatile memory element of each stage of non-volatile memory device during the reading period comprises:
transmitting data stored in a non-volatile memory element of an Nth stage of non-volatile memory device to an (N+1)th stage of non-volatile memory device via an output terminal of a logic memory circuit of the Nth stage of non-volatile memory device during the reading period, wherein N is a positive integer greater than 1.

3. The testing method of claim 1, wherein the step of receiving the test data in the test mode comprises:
receiving the stored data provided by an (N−1)th stage of non-volatile memory device via a test input terminal of an Nth stage of non-volatile memory device in the test mode, wherein N is a positive integer greater than 1.

4. The testing method of claim 3, wherein the step of outputting the stored data stored in the non-volatile memory element of each stage of non-volatile memory device during the reading period comprises:
providing the stored data to an external combinational logic circuit and the test input terminal of an (N+1)th stage of non-volatile memory device.

5. The testing method of claim 1, wherein the step of receiving the test data in the test mode further comprises:
receiving a clock signal and a first test enable signal; and
entering the test mode according to the enabling first test enable signal.

6. The testing method of claim 1, wherein the step of receiving the external data in the normal mode comprises:
   receiving a second test enable signal; and
   entering the normal mode according to the enabling second test enable signal, wherein the second test enable signal is an inversion signal of a first test enable signal.

* * * * *